Aug. 18, 1964 J. C. MARINACE 3,145,123
DEGENERATE DOPING OF SEMICONDUCTOR MATERIALS
Filed Nov. 4, 1960
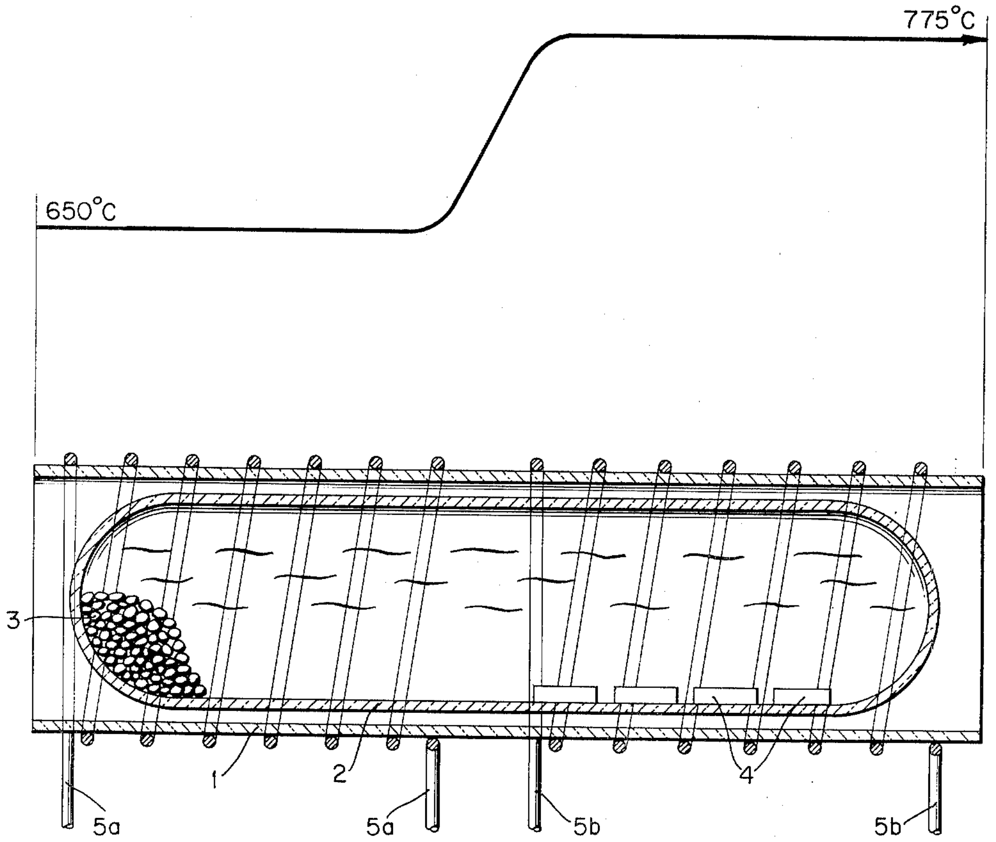
INVENTOR
JOHN C. MARINACE
BY John F. Ohlandt Jr.
ATTORNEY 3,145,123
Patented Aug. 18, 1964

3,145,123

DEGENERATE DOPING OF SEMICONDUCTOR MATERIALS

John C. Marinace, Yorktown Heights, N.Y., assignor to International Business Machines Corporation, New York, N.Y., a corporation of New York Filed Nov. 4, 1960, Ser. No. 67,400
4 Claims. (Cl. 148—33.1)

This invention relates to the formation of semiconductor devices and in particular to the formation of semiconductor devices that have come to be known in the art as Esaki or tunnel diodes.

The nature and characteristics of the tunnel diode were first discussed in an article entitled, "New Phenomenon in Narrow Germanium P–N Junctions," by Leo Esaki, Physical Review, vol. 109, January 15, 1958. As described by Esaki, this diode is a P–N junction device in which the junction is very thin, that is, on the order of 150 angstrom units or less. This novel diode exhibits in the direction of forward bias an anomalous current voltage characteristic. In particular, the characteristic displays two positive resistance regions separated by a transitional negative resistance region. The actual P–N junction discussed in the aforesaid article was fabricated by alloying techniques and the acceptor concentration in the P-type side and the donor concentration in the N-type side were respectively $1.6 \times 10^{19}$ atoms per cubic centimeter and approximately $10^{19}$ atoms per cubic centimeter.

Since the appearance of the article referred to above, there has been an intense interest in applications for this new device, particularly in the computer field where such a device may be advantageously employed in logical and memory circuits.

In attempting to exploit the new phenomenon of the tunnel diode, it has not yet been fully determined just what doping range may be optimum. It has been generally believed, in line with the Physical Review article, that impurity concentrations would have to be higher than approximately $10^{19}$ atoms per cubic centimeter. Consequently, those impurities which have high solubilities in germanium have received most, if not all, of the attention. For example, antimony has been one of the elements selected as a dopant for germanium in making tunnel diodes, but antimony barely serves as a degenerate dopant and then only under the most special conditions. Its maximum solubility in germanium is reported to be $1.3 \times 10^{19}$ atoms per cubic centimeter.

What has been discovered is that tunnel diode characteristics depend not only on the concentration of the impurity but also in some as yet unknown way upon the nature of the impurity. What has been further discovered is that Group II elements, and in particular that zinc, may be efficaciously employed as an impurity or dopant in germanium to produce degeneracy, thereby making the germanium suitable for use in tunnel diodes. Such efficacious employment runs counter to the fact that the maximum solid solubility of zinc in germanium is reported to be $2.6 \times 10^{18}$ atoms per cubic centimeter. Many advantages result from the use of zinc, in addition to the lowering of the doping concentration required. Zinc has a relatively high vapor pressure and a relatively high diffusion coefficient in germanium compared to other acceptor-type impurities. For the latter reason it is thus a fairly easy matter to saturate a wafer of germanium with zinc by diffusion. Another advantage is that highly purified zinc is readily available.

It is, therefore, a primary object of the present invention to provide degenerately doped semiconductor material suitable for use in fabricating tunnel diodes.

Another object is to provide the doped material by employing a very simple diffusion technique.

A further object is to achieve tunnel diode structures without requiring the high concentration of doping previously thought necessary.

The foregoing and other objects, features and advantages of the invention will be apparent from the following more particular description of a preferred embodiment of the invention, as illustrated in the accompanying drawing.

The figure is a schematic illustration of apparatus used in accordance with a preferred manner of achieving degenerate doping of semiconductor material.

Referring now to the figure, there is shown a reaction container 1, around which are wound resistance windings *5a* and *5b*, connected to a source of power, not shown, the windings serving to provide a source of heat. Inside the reaction container is an evacuated quartz tube 2, containing the impurity element 3, which in this particular example is zinc, situated at one end of the tube and a plurality of germanium wafers 4, approximately .005 inch thick, at the other end of the tube. A correlated temperature profile illustrates the particular temperatures that have been selected for use at each end of the tube. The temperature of 775° C. was chosen as the diffusion temperature because it is the temperature at which the solubility of zinc in germanium is a maximum. The temperature of approximately 650° C. at the cool end of the tube maintains a constant vapor pressure of zinc.

Two successful experimental runs have been made in accordance with the technique of the present invention; one was of 264 hours' duration and the other of approximately 400 hours. These experimental runs were carried out with a temperature of approximately 700° at the cool end. After the diffused wafers had been removed from the tube they were lapped on one face until they were between .002 inch and .003 inch in thickness. A small disc or chip was then soldered to a metal strip using Sn:Ga as the soldering material. On the opposite face, an alloy junction was made using Sn:As. The As and Ga concentration in the Sn were about one atom percent. The diodes thus fabricated exhibited tunnel diode characteristics.

What has been achieved by the present invention is a relaxation of the doping requirements for producing tunnel diodes and a simplified procedure in obtaining the degenerate material necessary for their production.

While the invention has been particularly shown and described with reference to a preferred embodiment thereof, it will be understood by those skilled in the art that the foregoing and other changes in form and details may be made therein without departing from the spirit and scope of the invention.

What is claimed is:

1. A semiconductor device comprising a germanium crystalline wafer having contiguous regions of opposite conductivity type which are degenerately doped so as to define a tunneling junction having a V–I characteristic with a well-defined negative resistance region separating two positive resistance regions, the region of $p$ conductivity type having a concentration of zinc of approximately $2.6 \times 10^{18}$ atoms/cc.

2. The device as defined in claim 1 wherein the $n$ conductivity type region is an alloyed region on the surface of said wafer, with tin and arsenic as the alloying materials.

3. A semiconductor device comprising a germanium crystalline wafer having two contiguous regions of opposite conductivity type degenerately doped so as to define a tunneling junction having a V–I characteristic with a well-defined negative resistance region separating two positive resistance regions, the $p$ conductivity type region having a zinc concentration of approximately $2.6 \times 10^{18}$ atoms/cc.

4. The device as defined in claim 3, wherein said junction is an alloyed junction on one surface of said wafer, and having an ohmic contact on the opposite surface of said wafer.

References Cited in the file of this patent

UNITED STATES PATENTS

| | | |
|---|---|---|
| 2,776,920 | Dunlap | Jan. 8, 1957 |
| 2,956,913 | Mack et al. | Oct. 18, 1960 |
| 3,033,714 | Ezaki et al. | May 8, 1962 |

OTHER REFERENCES

Physical Review, vol. 102, No. 3, May 1, 1956, pages 647–655.

Physical Review, Esaki, vol. 109, 1958, pages 603–605.

Journal of Applied Physics, vol. 19, No. 10, October 1958, page 1511.